US010620624B2

(12) United States Patent
Liang et al.

(10) Patent No.: US 10,620,624 B2
(45) Date of Patent: *Apr. 14, 2020

(54) REMOTE CONTROL AND FLYING APPARATUS

(71) Applicant: AUTEL ROBOTICS CO., LTD., Shenzhen, Guangdong (CN)

(72) Inventors: Zhiying Liang, Guangdong (CN); Yongshuia Wang, Guangdong (CN)

(73) Assignee: AUTEL ROBOTICS CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/260,585

(22) Filed: Jan. 29, 2019

(65) Prior Publication Data

US 2019/0155273 A1 May 23, 2019

Related U.S. Application Data

(63) Continuation of application No. 15/883,590, filed on Jan. 30, 2018, now Pat. No. 10,317,898, which is a
(Continued)

(51) Int. Cl.
*G05D 1/00* (2006.01)
*B64C 39/02* (2006.01)
(Continued)

(52) U.S. Cl.
CPC .......... *G05D 1/0016* (2013.01); *A63H 30/04* (2013.01); *B64C 39/024* (2013.01);
(Continued)

(58) Field of Classification Search
CPC .. G05D 1/0016; G05D 1/0038; G05D 1/0094; G05D 1/0022; H05K 5/0017;
(Continued)

(56) References Cited

U.S. PATENT DOCUMENTS

| 7,619,573 | B2 * | 11/2009 | Jung ............... H01Q 1/2266 343/702 |
| 10,317,898 | B2 * | 6/2019 | Liang ............... B64C 39/024 |
| 2009/0040115 | A1 * | 2/2009 | Zhang ............... H01Q 1/243 343/702 |

(Continued)

FOREIGN PATENT DOCUMENTS

| CN | 204140641 U | | 2/2015 |
| CN | 204170423 U | * | 2/2015 |
| CN | 204170423 U | | 2/2015 |

(Continued)

OTHER PUBLICATIONS

International Search Report dated Jun. 14, 2017; PCT/CN2016/098864.
USPTO NOA dated Jan. 17, 2019 in connection with U.S. Appl. No. 15/883,590.

* cited by examiner

*Primary Examiner* — Rockshana D Chowdhury

(57) ABSTRACT

The present application relates to a remote control and a flying apparatus. The remote control includes a remote control body and a display assembly including a display screen and being rotatably connected to the remote control body, so that the remote control has its own display screen. When the remote control is used, the display screen can be seen by turning the display assembly open, and the operation is relatively convenient. When the remote control is not used, the display assembly is closed, so that the space needed for packing the remote control is relatively small, facilitating carriage of the remote control. The remote control body is disposed separate from the display screen, so that an operation region and a display region do not affect each other, and the display area of the display screen can be configured larger, thereby improving the visual experience of a user.

11 Claims, 10 Drawing Sheets

Related U.S. Application Data continuation of application No. PCT/CN2016/098884, filed on Sep. 13, 2016.

(51) Int. Cl.
*H05K 5/02* (2006.01)
*H05K 5/00* (2006.01)
*A63H 30/04* (2006.01)
*G05G 7/10* (2006.01)

(52) U.S. Cl.
CPC ......... *G05D 1/0022* (2013.01); *G05D 1/0038* (2013.01); *G05D 1/0094* (2013.01); *G05G 7/10* (2013.01); *H05K 5/0017* (2013.01); *H05K 5/0226* (2013.01); *B64C 2201/146* (2013.01)

(58) Field of Classification Search
CPC ................ H05K 5/0226; B64C 39/024; B64C 2201/146; A63H 30/04
USPC ........................................................ 361/728
See application file for complete search history.

(56) References Cited

U.S. PATENT DOCUMENTS

| | | | | |
|---|---|---|---|---|
| 2010/0321255 | A1* | 12/2010 | Kough | ................ H01Q 1/2266 343/702 |
| 2011/0047751 | A1* | 3/2011 | Chen | .................... G06F 1/1681 16/303 |
| 2012/0089274 | A1 | 4/2012 | Lee et al. | |
| 2015/0371534 | A1* | 12/2015 | Dimberg | ................ G08C 17/02 340/12.5 |

FOREIGN PATENT DOCUMENTS

| | | | |
|---|---|---|---|
| CN | 104750114 | A * | 7/2015 |
| CN | 104750114 | A | 7/2015 |
| CN | 204989977 | U | 1/2016 |
| CN | 205490902 | U * | 8/2016 |
| CN | 205490902 | U | 8/2016 |

…

REMOTE CONTROL AND FLYING APPARATUS

CROSS-REFERENCE

This application is a continuation of U.S. patent application Ser. No. 15/883,590 filed on Jan. 30, 2018, which is a continuation of International Application No. PCT/CN2016/098884 filed on Sep. 13, 2016, both of which are incorporated herein by reference in their entirety.

BACKGROUND

Technical Field

The present application relates to the field of flying technologies, and in particular, to a remote control and a flying apparatus.

Related Art

Most of the existing remote controls adopt external display screens. For example, a clamping member is added on a remote control to clamp a mobile phone, a tablet computer, or the like, and a display screen of the mobile phone or a display screen of the tablet computer is used as a display screen of the remote control. In use, an external display screen needs to be connected, and the operation is relatively complex. The total number of a clamping member of an external display screen, the display screen and components of the remote control is relatively large, and a relatively large packaging space is needed, causing inconvenience in carriage. In addition, the area, which can be supported by the clamping member, on the remote control is small. If the display screen is excessively large, the operation of the remote control is blocked. Due to limitation of space, the size of a display screen that can be externally connected is relatively small, causing relatively poor visual experience.

SUMMARY

On such basis, the present application provides a remote control and a flying apparatus, so as to resolve technical problems of a complex operation, a requirement for a relatively large packaging space, and a relatively small size of an external display screen caused by externally hanging the display screen.

An embodiment of the present application provides a remote control, including:

a remote control body; and a display assembly, the display assembly including a display screen, and the display assembly being rotatably connected to the remote control body.

The remote control further includes an first antenna, and the display assembly further comprises a cavity, the first antenna being disposed in the cavity.

The display assembly further includes a cover bottom plate and a screen fixing bracket, the cavity being formed by enclosure of the cover bottom plate, the screen fixing bracket and the bottom of the display screen, the display screen being fixed on an upper side of the screen fixing bracket, and the cover bottom plate being fixed on a lower side of the screen fixing bracket.

The cover bottom plate is a non-metallic material, the first antenna being fixed on the cover bottom plate or on an inner side of the screen fixing bracket.

The cover bottom plate is a metallic material, the first antenna being fixed on an inner side of the screen fixing bracket.

A first clamping slot and a first buckle are disposed in the cavity, the first buckle being disposed on two sides of the first clamping slot, and the first antenna being embedded into the first clamping slot and being fastened by the first buckle.

The first antenna includes at least one of the following antennas:

an image transmission antenna, a flight control antenna, a WiFi antenna, a GPS antenna, an LTE antenna, or a composite antenna, the composite antenna being compounded by at least two of the image transmission antenna, the flight control antenna, the WiFi antenna, the GPS antenna, or the LTE antenna.

The remote control further includes a second antenna, the second antenna being disposed in the remote control body.

The second antenna is disposed on a side, close to the display assembly, in the remote control body.

A second clamping slot and a second buckle are disposed in the remote control body, the second buckle being disposed on two sides of the second clamping slot, and the second antenna being embedded into the second clamping slot and being fastened by the second buckle.

The second antenna includes at least one of the following antennas:

an image transmission antenna, a flight control antenna, a WiFi antenna, a GPS antenna, an LTE antenna, or a composite antenna.

The display assembly is rotatably connected to the remote control body by using a hinge.

The hinge includes:

a rotation member, the rotation member including a rotation shaft;

a fixing member, the fixing member being fixed to the remote control body, and being provided with a first through hole, and the rotation shaft penetrating through the first through hole; and a fixing block, fixed to the display assembly, and provided with a second through hole, the rotation shaft penetrating through the second through hole, one side of the fixing block being fixed to the display assembly, and the other side of the fixing block being fixed to the rotation shaft.

The fixing member further includes:

a stopping block, stretched out by the fixing member on a side close to the rotation shaft, the stopping block further including a connection edge, the connection edge being provided with the first through hole;

the rotation member including:

a limiting block, provided with a third through hole, the limiting block being sleeved on the rotation shaft, and an outer edge of the limiting block being provided with an abutting portion; and a spring, configured to provide a tension force, where the rotation shaft sequentially penetrates through the second through hole, the limiting block and the spring, wherein when an external force is applied to open the display assembly, the rotation shaft rotates and drives the fixing member to rotate, and rotation of the fixing member drives the display assembly to rotate;

after the display assembly is opened and application of the external force is stopped, the limiting block does not rotate relative to the rotation shaft under the effect of a frictional force generated by the tension force of the spring, so that the display assembly keeps an opened angle; and when the display assembly is closed, the abutting portion moves towards a direction close to the stopping block, and when the display assembly is completely closed, the abutting portion abuts against the stopping block.

The remote control body is provided with at least one of a joystick assembly or a knob assembly;

the joystick assembly includes a joystick bracket and a joystick, the joystick bracket being fixed in the remote control body, the joystick being rotatably connected to the joystick bracket, and the joystick stretching out of a surface which is closed with the display assembly, of the remote control body; and the knob assembly includes a knob handle and a knob, the knob handle being fixed in the remote control body, the knob being rotatably connected to the knob handle, and the knob protruding out of a side of the remote control body.

An embodiment of the present application further provides a flying apparatus, including an unmanned aerial vehicle and the foregoing remote control.

The beneficial effects of the embodiments of the present application lie in that, the remote control provided in the embodiments of the present application includes a remote control body and a display assembly, the display assembly including a display screen and being rotatably connected to the remote control body, so that the remote control has its own display screen; when the remote control is used, the display screen can be seen by turning the display assembly open, and the operation is relatively convenient; when the remote control is not used, the display assembly is closed, so that the space needed for packing the remote control is relatively small, facilitating carriage of the remote control; the remote control body is disposed separate from the display screen, so that an operation region and a display region do not affect each other, and the display area of the display screen can be configured larger, thereby improving the visual experience of a user.

BRIEF DESCRIPTION OF THE DRAWINGS

One or more embodiments are exemplarily described by means of the accompanying drawings corresponding thereto. The exemplary descriptions do not constitute a limitation to the embodiments. Elements having same reference numbers in the accompanying drawings represent similar elements. Unless otherwise particularly stated, the figures in the accompanying drawings do not constitute a proportional limitation.

REFERENCE SIGNS

400—remote control; 100—remote control body; 110—joystick assembly; 111—joystick bracket; 112—joystick; 140—knob assembly; 141—knob handle; 142—knob; 120—second clamping slot matching assembly; 121—second clamping slot; 122—second buckle; 200—display assembly; 210—display screen; 221—cover bottom plate; 222—screen fixing bracket; 230—composite antenna; 231—image transmission antenna; 232—flight control antenna; 240—first clamping slot matching assembly; 241—first clamping slot; 242—first buckle; 300—hinge; 310—fixing member; 320—fixing rod; 321—stopping block; 3211—connection edge; 32111—first through hole; 330—rotation member; 331—fixing block; 3311—second through hole; 332—rotation shaft; 3321—thread; 333—limiting nut; 334—limiting block; 3341—abutting portion; 3342—third through hole; 335—gasket; 336—spring; 337—end nut; 500—antenna; 700—antenna; 600—unmanned aerial vehicle; 800—flying apparatus.

DETAILED DESCRIPTION

To make the objective, technical solutions and advantages of the present application clearer, the present application is further described below in detail with reference to the accompanying drawings and embodiments. It should be understood that the specific embodiments described herein are merely used to explain the present application, rather than limit the present application.

Embodiment 1

As shown in FIG. 1 to FIG. 4, a remote control 400 provided in an embodiment of the present application includes a remote control body 100 and a display assembly 200, the display assembly 200 including a display screen 210 and being rotatably connected to the remote control body 100, so that the remote control 400 has its own display screen 210. When the remote control 400 is used, the display screen 210 can be seen by turning the display assembly 200 open, and the operation is relatively convenient. When the remote control 400 is not used, the display assembly 200 is closed, so that the space needed for packing the remote control 400 is relatively small, facilitating carriage of the remote control 400. Further, the display screen 210 may alternatively be a touch display screen, that is, a touch panel is added on the display screen to perform a touch operation on a control displayed on the display screen. The remote control body 100 is disposed separate from the display screen 210, so that an operation region and a display region do not affect each other, and the display area of the display screen 210 can be configured larger, thereby improving the visual experience of a user.

Figure 1:
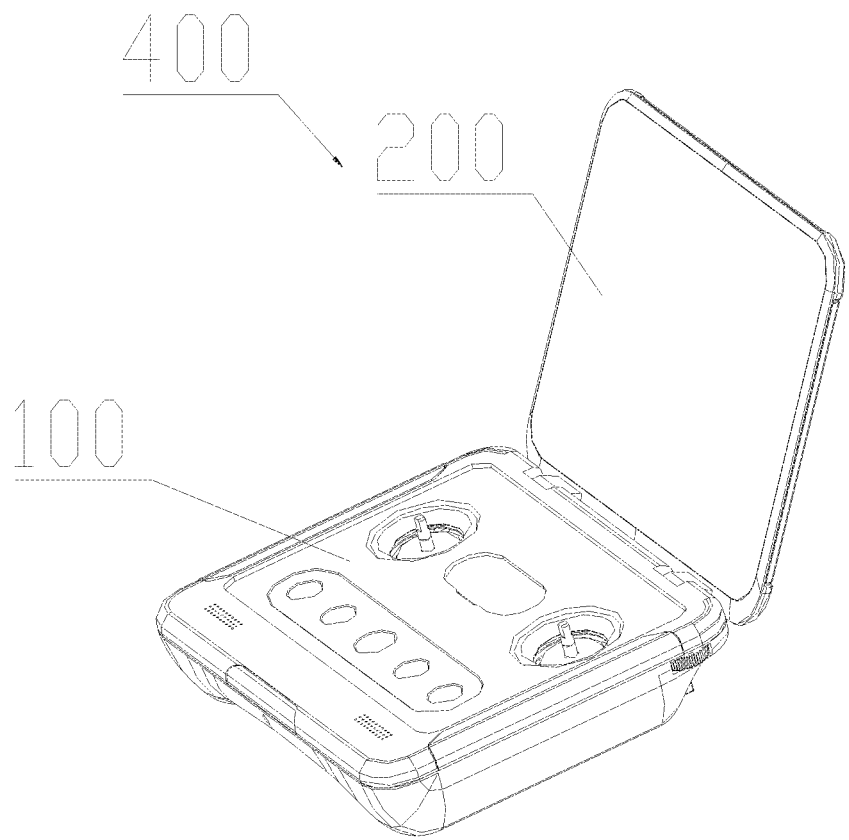
FIG. 1 is a schematic structural diagram of a remote control according to an embodiment of the present application.
Figure 2:
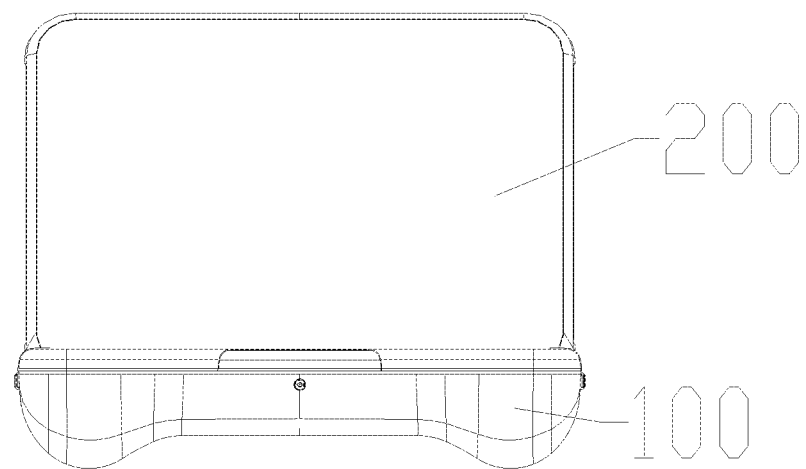
FIG. 2 is a front view of the remote control according to the embodiment of the present application.
Figure 3:
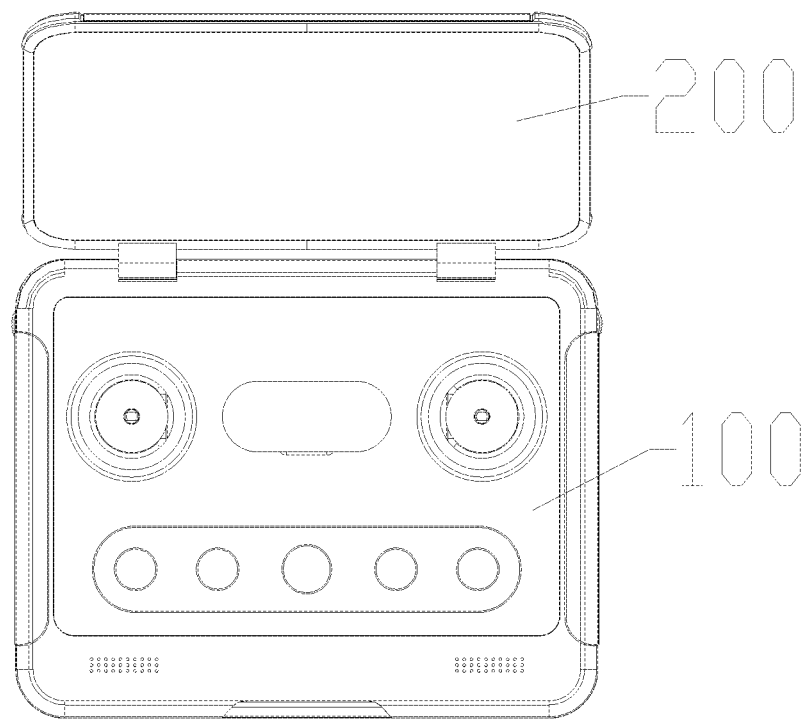
FIG. 3 is a top view of the remote control according to the embodiment of the present application.
Figure 4:
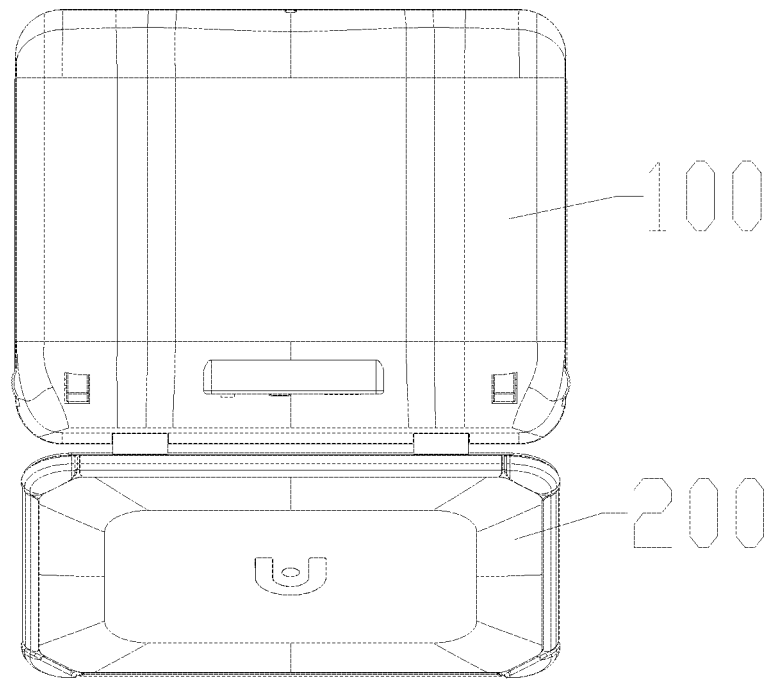
FIG. 4 is a bottom view of the remote control according to the embodiment of the present application.
Figure 5:
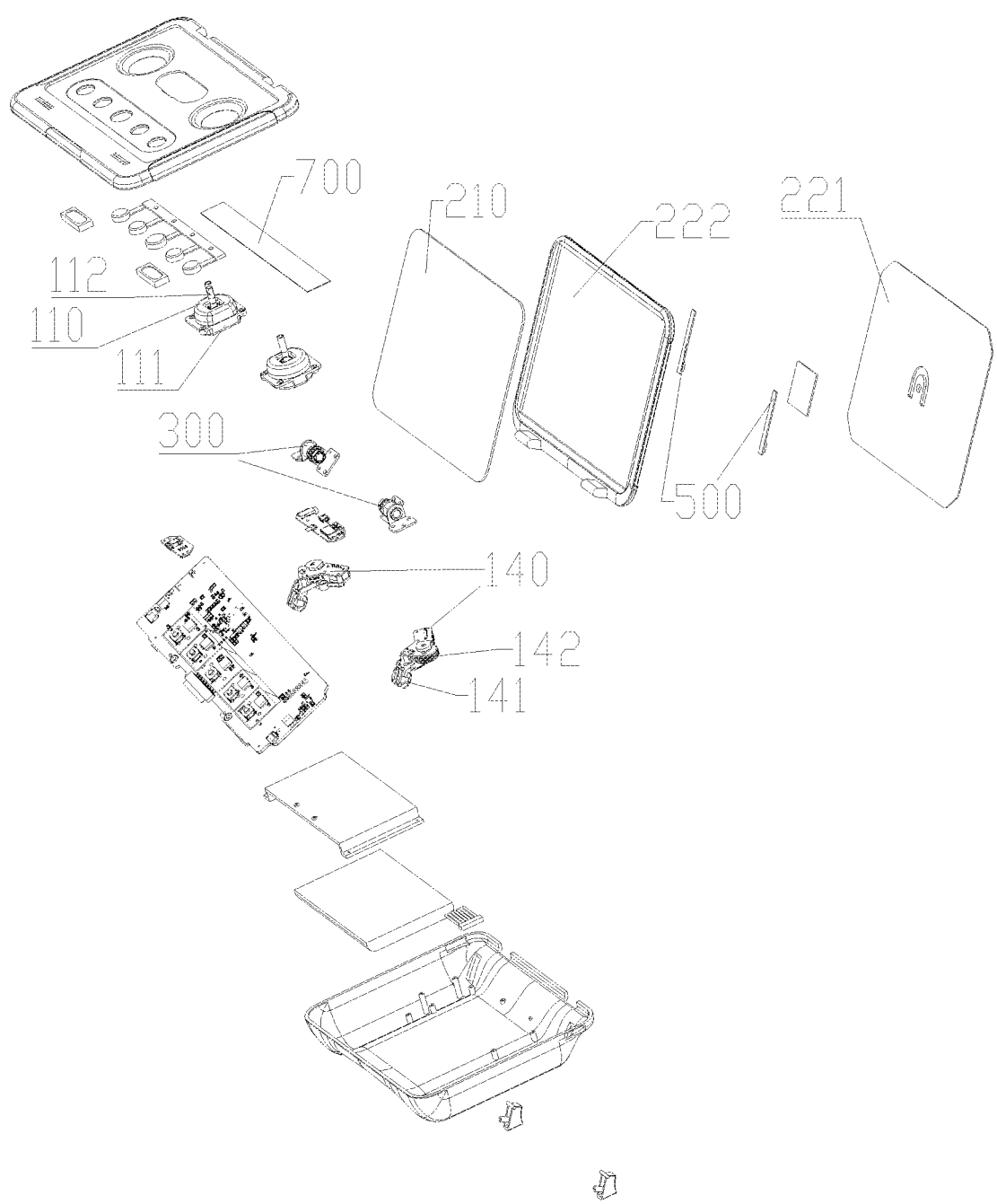
FIG. 5 is an exploded view of the remote control according to the embodiment of the present application.
Figure 6:
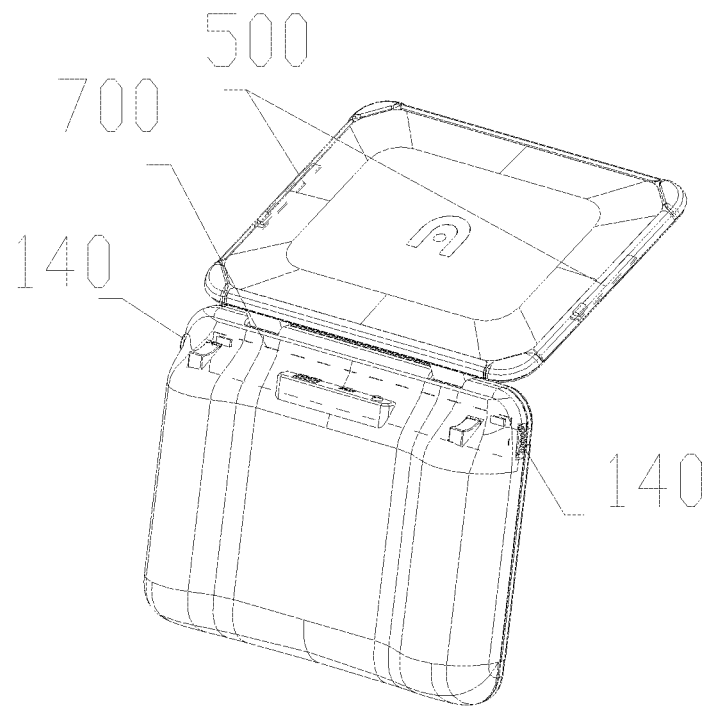
FIG. 6 is a schematic structural diagram of a remote control according to another embodiment of the present application.

The positions where an antenna 500 (first antenna) and an antenna 700 (second antenna) are placed are schematically marked in FIG. 6. As shown in FIG. 5 to FIG. 8, in another embodiment, the remote control 400 further includes an antenna 500, the antenna 500 being disposed in the display assembly 200. The antenna 500 is one or more of an image transmission antenna, a flight control antenna, a WiFi antenna, a GPS antenna, an LTE antenna, or a composite antenna 230. The composite antenna 230 is compounded by at least two of the image transmission antenna, the flight control antenna, the WiFi antenna, the GPS antenna, or the LTE antenna, and there is at least one antenna 500.

In another embodiment, the antenna 700 is disposed in the remote control body 100. The antenna 700 is one or more of an image transmission antenna, a flight control antenna, a wireless network antenna (such as a WiFi antenna), an alignment antenna (such as a GPS antenna), a mobile communications antenna (such as an LTE antenna), or a composite antenna 230. The composite antenna 230 is compounded by at least two of the image transmission antenna, the flight control antenna, the wireless network antenna (such as the WiFi antenna), the alignment antenna (such as the GPS antenna), or the mobile communications antenna (such as the LTE antenna), and there is at least one antenna 700.

Figure 9:
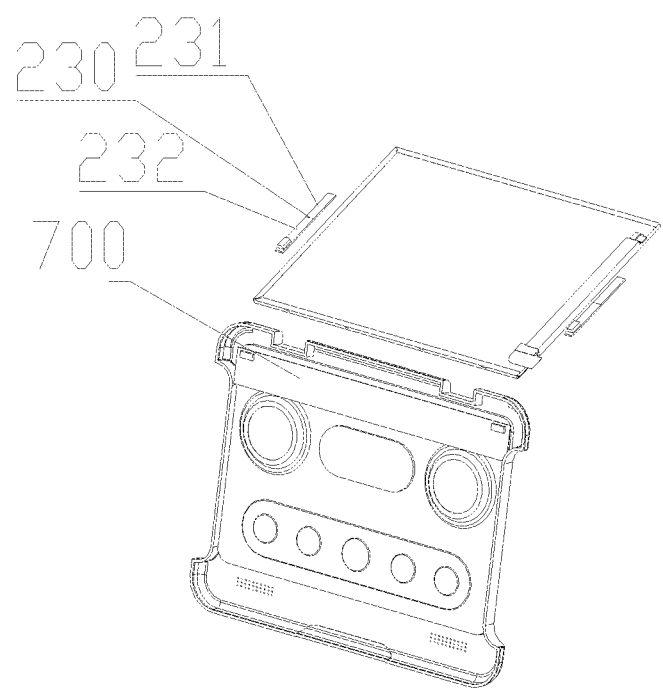
FIG. 9 is a partial schematic structural diagram of a remote control including a composite antenna according to an embodiment of the present application.
Figure 10:
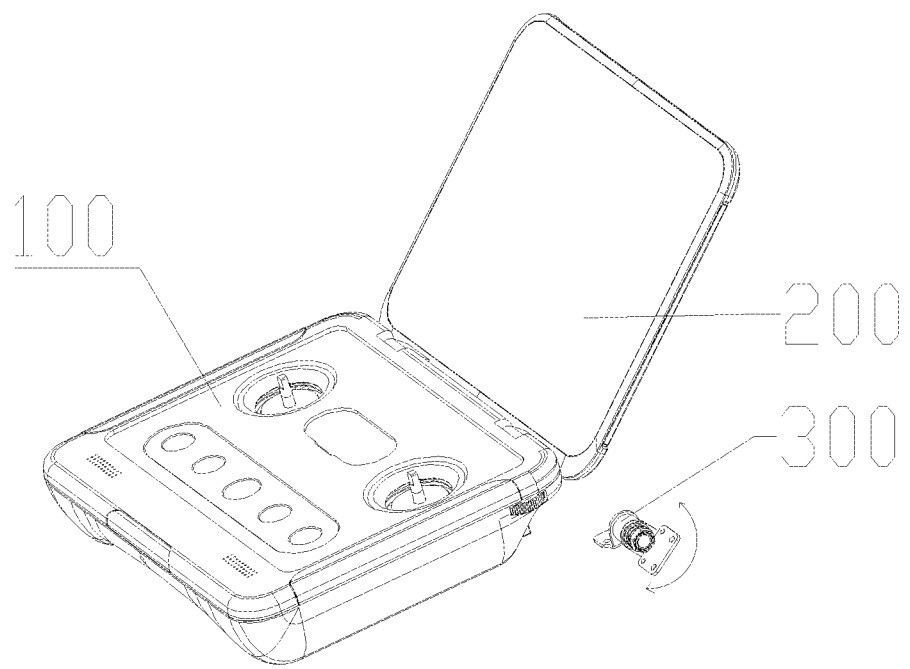
FIG. 10 is a schematic diagram of a rotatable angle of a display assembly of a remote control according to an embodiment of the present application.
Figure 11:
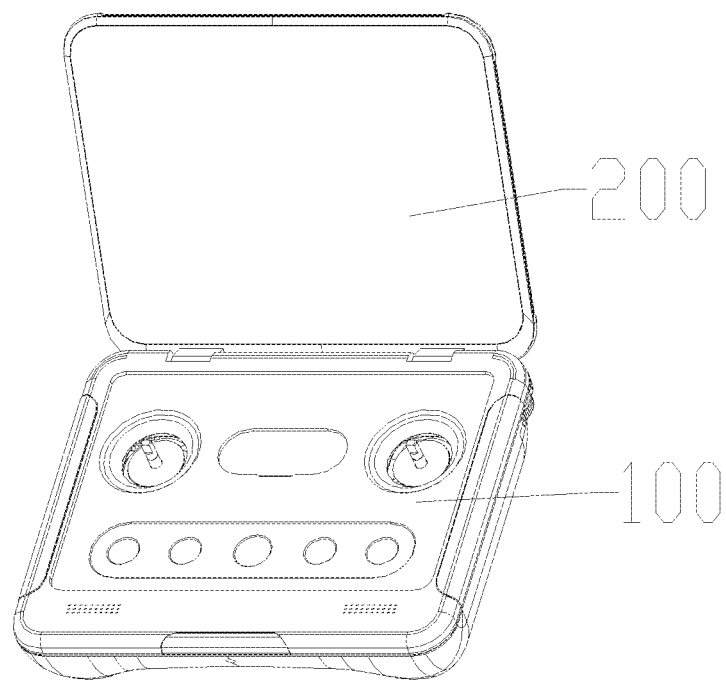
FIG. 11 is a schematic structural diagram of a remote control of which a display assembly is opened according to an embodiment of the present application.

FIG. 9 is a partial schematic structural diagram of the remote control 400 including the composite antenna 230 according to an embodiment of the present application. As shown in FIG. 9, in another embodiment, the antenna 500 is the composite antenna 230, the composite antenna 230 being compounded by an image transmission antenna 231 and a flight control antenna 232. Alternatively, the image transmission antenna 231 is located on an upper part of the antenna 500, and the flight control antenna 232 is located on a lower part of the antenna 500, or the transmission antenna 231 is located on the lower part of the antenna 500, and the flight control antenna 232 is located on the upper part of the antenna 500.

Figure 7:
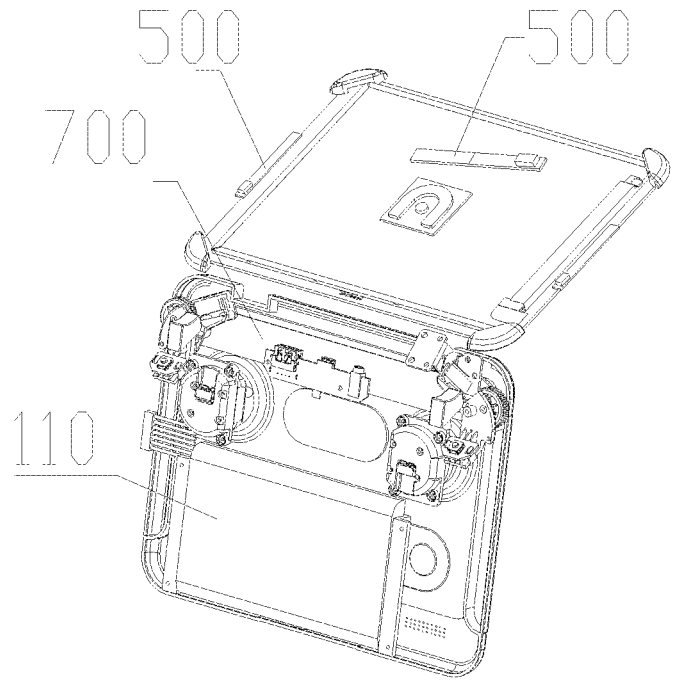
FIG. 7 is a schematic diagram of an internal structure of a remote control according to another embodiment of the present application.
Figure 8:
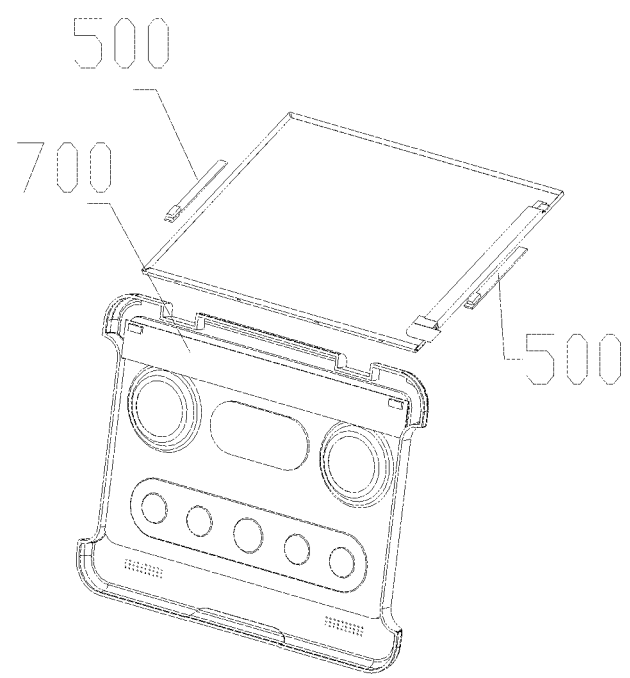
FIG. 8 is a partial schematic structural diagram of a remote control according to another embodiment of the present application.

FIG. 7 is a schematic diagram of an internal structure of the remote control 400 according to another embodiment of the present application. In FIG. 7, the remote control body 100 is rotatably connected to the display assembly 200. FIG. 8 is a structural diagram of the internal structure of the remote control 400 according to another embodiment of the present application. In FIG. 8, some structures in the remote control body 100 and the display assembly 200 are separately depicted. As shown in FIG. 7 and FIG. 8, in the present embodiment, the antenna 500 and the antenna 700 are respectively disposed in the display assembly 200 and the remote control body 100. One antenna 500 is spaced from the other antenna 500, so that signal interference is not generated when one antenna 500 and the other antenna 500 are both disposed in a built-in manner. In the prior art, when one antenna is disposed in a built-in manner, the other antenna needs to stretch out of the remote control 400 in use, and the two groups of antennas are relatively close to each other in space. When the angle of the antenna stretching out of the remote control 400 is adjusted, signal interference is easily generated between the antenna stretching out of the remote control 400 and the built-in antenna. In the present embodiment, the antenna 500 and the antenna 700 are respectively disposed on two entities, that is, the antenna 500 and the antenna 700 are respectively disposed in the display assembly 200 and the remote control body 100, wherein it is easily to find placement location far from interference parts such as metal materials or electronic elements. In addition, compared with adjusting the angle of the antenna 500, regarding turning the display assembly 200 open or placing the remote control 400 to a different direction, after the display assembly 200 is turned open, the antenna 500 is relatively far from the antenna 700 in space, and signal interference is not easily generated between the antenna 500 and the antenna 700. That is, in the present embodiment, the antenna 500 is relatively far from the antenna 700, so that the problem of signal interference generated between the antenna 500 and the antenna 700 is resolved.

Figure 12:
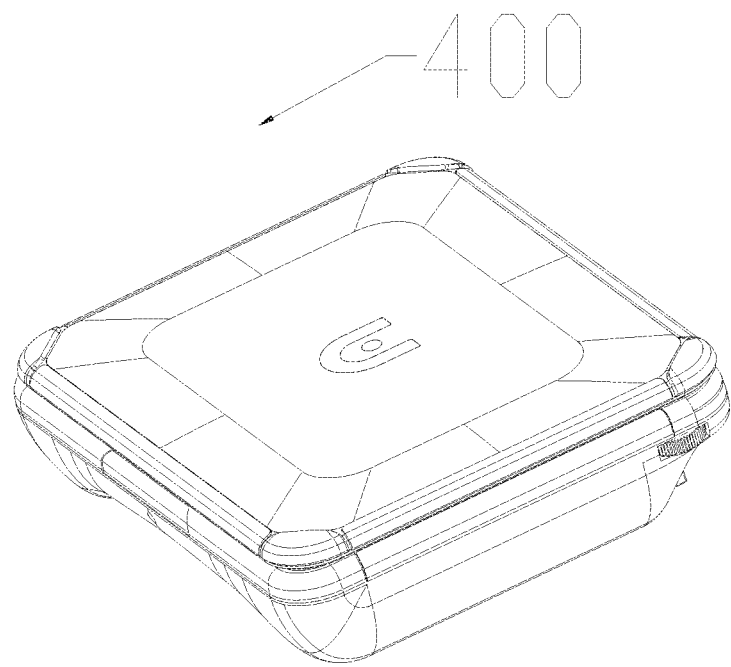
FIG. 12 is a schematic structural diagram of a remote control of which a display assembly is closed according to an embodiment of the present application.

The beneficial effects of this embodiment further lie in that, as shown in FIG. 1, FIG. 2, FIG. 10 and FIG. 11, in use, when the display assembly 200 is turned open, since the antenna 500 is disposed in the display assembly 200, or since the antenna 700 is disposed in the remote control body 100, that is, the antenna 500 or the antenna 700 is disposed in a built-in manner, on one hand, compared with the manner in the prior art of pulling out a telescopic antenna when the remote control is used, in the technical solution of the present embodiment, when the remote control 400 is used, the antenna 500 or the antenna 700 is disposed in a completely built-in manner, reducing the possibility of cases where the antenna 500 or the antenna 700 is unintentionally touched, accidentally broken, or accidentally damaged. In addition, the overall appearance of the remote control 400 with the built-in antenna 500 or antenna 700 is more coordinate, and is more esthetic in design. On the other hand, compared with the manner in the prior art of rotating the antenna to a particular angle or contracting the antenna, so as to place the remote control 400 into a packaging box or a packaging bag of the remote control 400 when the remote control is not used, as shown in FIG. 12, in the technical solution of this embodiment, when the remote control 400 is not used, the remote control 400 can be placed into the packaging box or the packaging bag of the remote control 400 by directly closing the display assembly 200.

Further, a user usually needs to manually adjust the angle of the antenna when using the remote control 400 in the prior art, to achieve an optimal antenna angle for receiving and sending signals, which is not intelligent. In the present embodiment of the present application, signals received by the antenna 500 or the antenna 700 may be processed by using software, or may be processed by using one or more of various filters, amplifiers, demodulators, multipliers, or analog to digital converters, to strengthen the needed signals without manual adjustment on the angle of the antenna 500 or the antenna 700 to achieve an optimal angle for receiving and sending signals.

Furthermore, the antenna 500 or the antenna 700 may be designed as a chip antenna, a cylindrical antenna, or an odd-form antenna, as long as the function of the antenna 500 or the antenna 700 can be implemented. This is not limited in the present application. The antenna 500 may be configured as an antenna such as a 2G antenna, a 2.4G antenna, a 5.8G antenna, or a 900 M antenna according to radio regulations, institutions of different countries and set frequency bands.

Further, the image transmission antenna is located on the upper part of the antenna 500 or the antenna 700, and the flight control antenna is located on the lower part of the antenna 500 or the antenna 700, or the transmission antenna is located on the lower part of the antenna 500 or the antenna 700, and the flight control antenna is located on the upper part of the antenna 500 or the antenna 700.

As shown in FIG. 5, in another embodiment, the display assembly 200 further includes a cover bottom plate 221 and a screen fixing bracket 222. The display screen 210 is fixed on an upper side of the screen fixing bracket 222, and the cover bottom plate 221 is fixed on a lower side of the screen fixing bracket 222.

In some embodiments, the cover bottom plate 221 may alternatively be formed by extension and enclosure of a periphery of the screen fixing bracket 222 towards the bottom of the display screen 210, that is, the cover bottom plate 221 is integrally formed with the screen fixing bracket 222.

When the cover bottom plate 221 is a non-metallic material, the antenna 500 is fixed on the cover bottom plate 221. Or when the cover bottom 221 is a metallic material, the antenna 500 is fixed on an inner side of the screen fixing bracket 222. When the cover bottom plate 221 is a metallic material, to avoid interference between the cover bottom plate 221 and the antenna 500, the antenna 500 is fixed on the inner side of the screen fixing bracket 222. When there are two antennas 500, the two antennas 50 are fixed on two inner sides of the screen fixing bracket 222. One antenna 00 is relatively far from the other antenna 500 in space, and signal interference is not easily generated between one antenna 500 and the other antenna 500.

Whereas when the cover bottom plate 221 is a non-metallic material, the antenna 500 is fixed on the cover bottom plate 221 or the inner side of the screen fixing bracket 222. When there are two antennas 500, the two antennas 500 are fixed on two inner sides of the screen fixing bracket 22, or one antenna 500 may be fixed on the inner side of the screen fixing bracket 222, and the other antenna 500 is fixed on the cover bottom plate 221. One antenna 500 is relatively far from the other antenna 500 in space, and signal interference is not easily generated between one antenna 500 and the other antenna 500.

Figure 13:
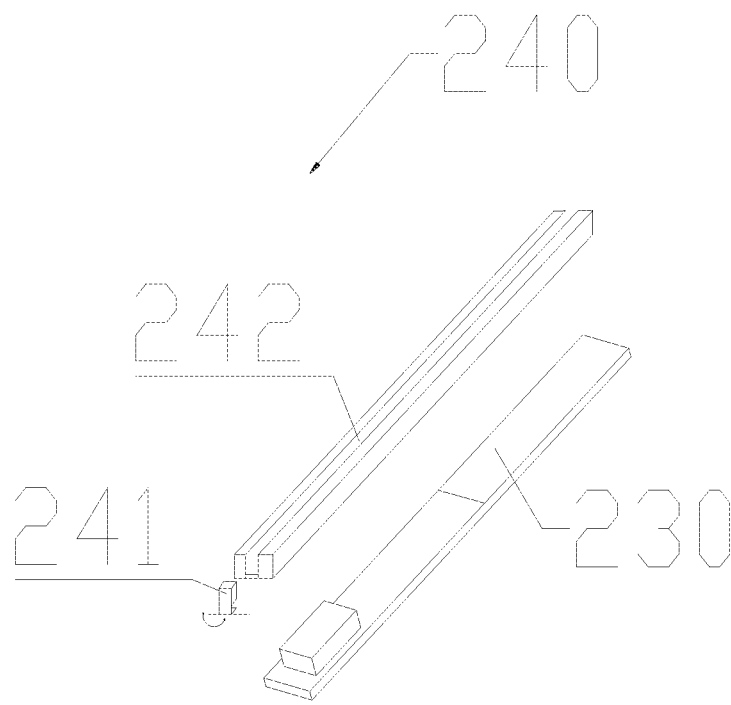
FIG. 13 is a partial schematic structural diagram of a remote control including a first clamping slot matching assembly according to an embodiment of the present application.

In another embodiment, the antenna 500 may be fixed by means of a clamping slot matching assembly or adhesive gluing. As shown in FIG. 13, a first clamping slot 241 and a first buckle 242 are disposed in the display assembly 200. A first clamping slot matching assembly 240 includes the first clamping slot 241 and the first buckle 242. The first buckle 242 is disposed on two sides of the first clamping slot 241. The antenna 500 is embedded into the first clamping slot 241 and is fastened by the first buckle 242. There are at least two first clamping slots 241. The number of first buckles 242 matches the number of the first clamping slots 241. The antenna 500 is embedded into the first clamping slot 241 and is fastened by the first buckle 242, the antenna 500 is fixed on the cover bottom plate 221 by means of adhesive gluing, or the antenna 500 is fixed on the inner side of the screen fixing bracket 222 by means of adhesive gluing; or the antenna 500 is fixed in the display assembly 200 by means of adhesive gluing.

As shown in FIG. 7 to FIG. 9, in another embodiment, the antenna 700 is disposed on a side, close to the display assembly 200, in the remote control body 100. The side, close to the display assembly 200, in the remote control body 100 is relatively far from a joystick assembly, a knob assembly, or another metal-containing material included in the remote control body 100. A chip antenna may be disposed in this region.

Figure 14:
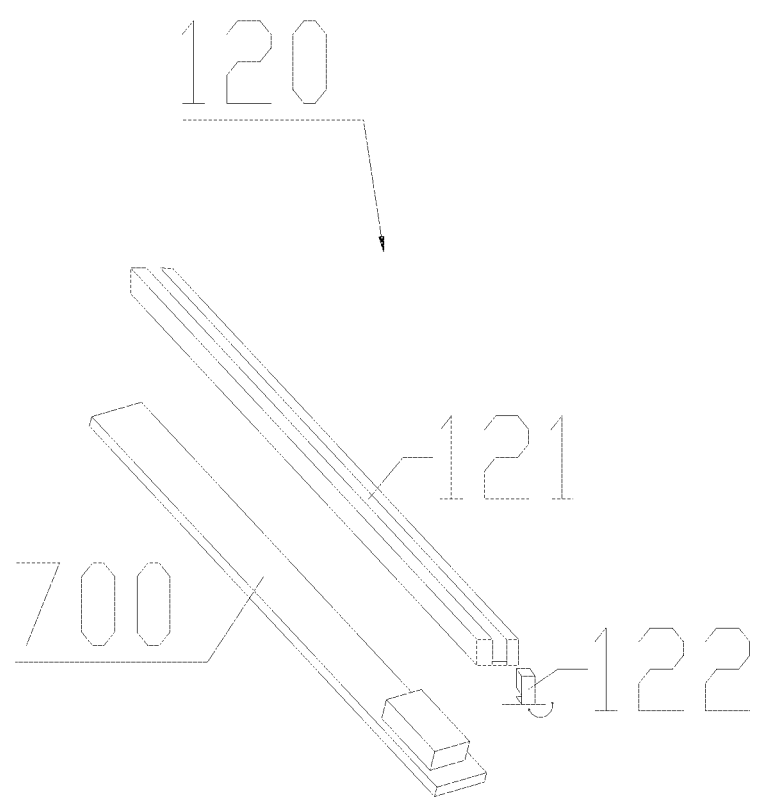
FIG. 14 is a partial schematic structural diagram of a remote control including a second clamping slot matching assembly according to an embodiment of the present application.

As shown in FIG. 14, alternatively, a second clamping slot 121 and a second buckle 122 are disposed in the remote control body 100. A second clamping slot matching assembly 120 includes the second clamping slot 121 and the second buckle 122. The second buckle 122 is disposed on two sides of the second clamping slot 121. The antenna 700 is embedded into the second clamping slot 121 and is fastened by the second buckle 122. There are at least two second clamping slots 121. The number of second buckles 122 matches the number of the second clamping slots 121. The antenna 700 is embedded into the second clamping slot 121 and is fastened by the second buckle 122, or the antenna 500 is fixed on the remote control body 100 by means of adhesive gluing.

Figure 15:
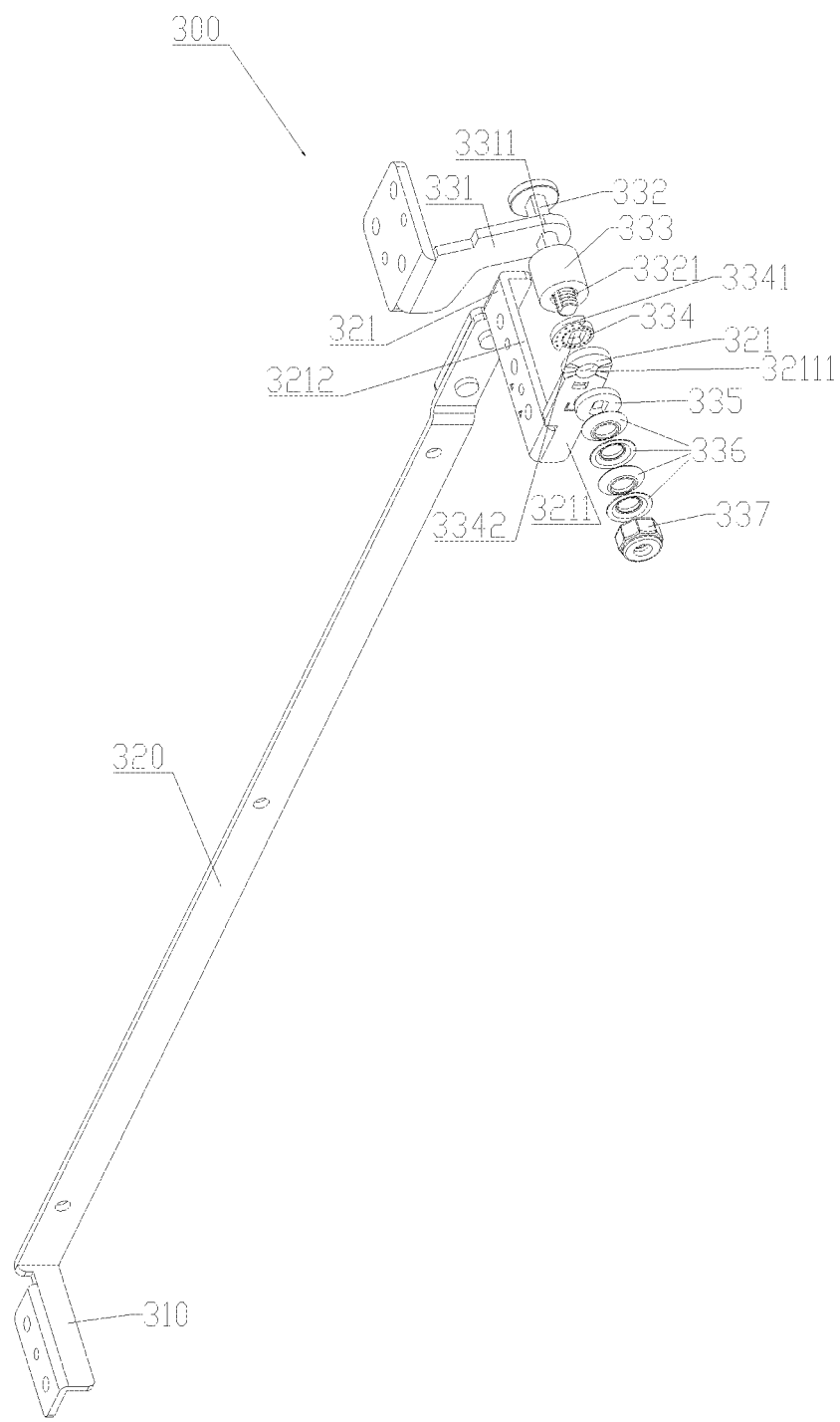
FIG. 15 is an exploded view of a hinge of a remote control according to an embodiment of the present application.

As shown in FIG. 15, in another embodiment, the rotatable connection between the display assembly 200 and the remote control body 100 is a connection manner of a hinge 300. The hinge 300 includes a fixing member 310, a fixing block 331 and a rotation shaft 332. The fixing member 310 is provided with a first through hole 32111, and is fixed to the remote control body 100. The fixing block 331 is provided with a second through hole 3311. One side of the fixing block 331 is fixed to the display assembly 200, and the other side of the fixing block 331 is fixed to the rotation shaft 332. The rotation shaft 332 penetrates through the second through hole 3311 and the first through hole 32111. The rotation shaft 332 rotates to drive the fixing block 331 to rotate. The rotation shaft 332 rotates relative to the fixing member 310, that is, the fixing block 331 rotates relative to the fixing member 310. The fixing block 331 is fixed to the display assembly 200 and the fixing member 310 is fixed to the remote control body 100. Therefore, the display assembly 200 rotates relative to the remote control body 100.

Further, the fixing member 310 includes a fixing rod 320, which is stretched out by the fixing member 310 towards one side. The rotation member 330 is rotatably connected to a side, far from the fixing member 310, of the fixing rod 320. The first through hole 32111 is disposed on the fixing rod 320. The fixing member 310 and the fixing rod 320 are both fixed on the remote control body 100. The rotation member 330 is fixed on the display assembly 200. The rotation member 330 is rotatably connected to the fixing rod 320, so that the display assembly 200 is rotatably connected to the remote control body 100.

Further, the fixing rod 320 stretches out a stopping block 321 on a side close to the rotation shaft 332. The stopping block 321 may be specifically configured as U-shaped. A connection edge 3211 may stretch out from one side of the stopping block 321. The connection edge 3211 may extend along a direction of a line parallel to a straight line where the fixing rod 320 is located. Further, the first through hole 32111 may be disposed on the connection edge 3211.

Further, the fixing block 331 may be configured as L-shaped. One edge of the fixing block 331 is fixed on the rotation shaft 332, and the other edge of the fixing block 331 is fixed to the display assembly 200. Furthermore, the rotation member 330 further includes a limiting nut 333, which is sleeved on the rotations haft 332. A thread 3321 is disposed on a side, close to the limiting nut, of the rotation shaft 332, or the rotation shaft 332 may be configured as a thread shaft. The thread shaft may be configured as a shape of an inner circle of a 400-meter standard runway. A thread on the thread shaft may be configured as a standard thread, preferably, a right handed thread. The rotation member 330 further includes a limiting block 334, which is provided with a third through hole 3342. The rotation shaft 332 penetrates through the third through hole 3342, that is, the limiting block 334 is sleeved on the rotation shaft 332. The third through hole 3342 may be configured as a shape adapted to the thread shaft, that is, the rotation shaft 332 abuts against a periphery of the third through hole 3342, so that the limiting block 334 is fixed on the rotation shaft 332, and the limiting block 334 does not rotate with rotation of the rotations haft 332.

Further, the limiting block 334 is provided with an abutting portion 3341, which may be disposed along a periphery of the limiting block 334, and may be configured as arc-shaped.

Furthermore, the rotation member 330 further includes a gasket 335, a spring 336 and an end nut 337. The gasket 335, the spring 336 and the end nut 337 are all sleeved on the rotation shaft 332. The gasket 335 may be provided with a fourth through hole (not shown), which may be configured as a shape adapted to the thread shaft, that is, the rotation shaft 332 abuts against a periphery of the fourth through hole to fix the gasket 335 on the rotation shaft 332. The rotation shaft 332 sequentially penetrates through the second through hole 3311 of the fixing block 331, the limiting nut 333, the third through hole 3342 of the limiting block 334, the first through hole 32111, the gasket 335 and the spring 336 and is locked by the end nut 337. There are at least two springs 336. The springs 336 may be configured as springs with variable diameters. One side of a smaller inner diameter of one spring with a variable diameter is in contact with one side of a smaller inner diameter of the other spring with a variable diameter. A tension force generated by the spring 336 makes a frictional force of rotation of the rotation shaft 332 relative to the fixing member 310 increase.

There may be at least two hinges 300. One hinge is disposed close to one side of the remote control body 100, and the other hinge is disposed close to the other side of the remote control body 100.

When the display assembly 200 of the remote control 400 is opened, the rotation shaft 332 rotates clockwise, and drives the fixing block 331 and the limiting block 334 to rotate clockwise, and the fixing block 331 rotates to drive the display assembly 200 to rotate. In this case, the abutting portion 3341 moves towards a direction away from the stopping block 321. After the display assembly 200 is opened by a particular angle, application of an external force is stopped. Because the frictional force between the limiting block 334 and the thread 3321 makes the limiting block not rotate relative to the rotation shaft 332, the display assembly 200 can stabilize and keep the current angle when being opened by the particular angle.

When the display assembly 200 of the remote control 400 needs to be closed, the rotation shaft 332 rotates anticlockwise, and the limiting block 334 also rotates anticlockwise. In this case, the abutting portion 3341 moves towards a direction close to the stopping block 321. When the display assembly 200 is completely closed, the abutting portion 3341 abuts against the stopping block 321. A rotation angle between the display assembly 200 and the remote control body 100 is approximate to a rotation angle of the rotation shaft 332. Further, by using a plane where the remote control body 100 is located as a reference plane, the rotation angle between the rotation shaft 332 and the fixing block 331 ranges between −5 degrees and 150 degrees.

Figure 16:
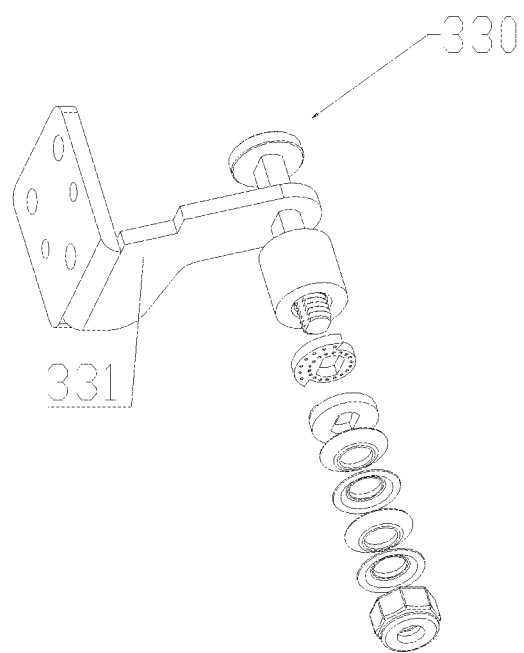
FIG. 16 is a partial exploded view of a remote control including a rotation member according to an embodiment of the present application.

As shown in FIG. 15 and FIG. 16, in another embodiment, the remote control body 100 is provided with at least one of a joystick assembly 110 or a knob assembly 140. The joystick assembly 110 includes a joystick bracket 111 and a joystick 112. The joystick bracket 111 is fixed in the remote control body 100. The joystick 112 is rotatably connected to the joystick bracket 111 and the joystick 112 stretches out of a surface, which is closed with the display assembly 200, of the remote control body 100. The joystick assembly 110 has a function of performing remote control on an unmanned aerial vehicle corresponding to the remote control 400.

Otherwise, in the present embodiment, the knob assembly 140 includes a knob handle 141 and a knob 142. The knob handle 141 is fixed in the remote control body 100. The knob 142 is rotatably connected to the knob handle 141, and the knob 142 protrudes out of a side of the remote control body 100. The unmanned aerial vehicle includes a pan-tilt-zoom (not shown in the figure) carrying a camera. The knob assembly 140 has an attitude angle that performs remote control on the pan-tilt-zoom, carrying the camera, of the unmanned aerial vehicle corresponding to the remote control 400. The attitude angle includes one or a combination of more of a pitch angle, a translation angle, or a roll angle.

Further, there may be at least two joystick assemblies 110 or knob assemblies 140.

Embodiment 2

Figure 17:
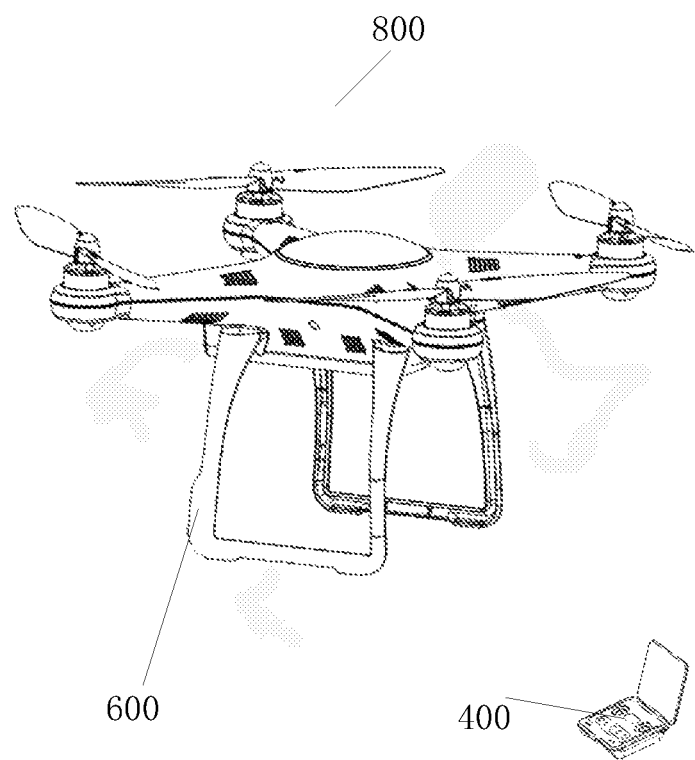
FIG. 17 is a schematic structural diagram of a flying apparatus according to an embodiment of the present application.

As shown in FIG. 17, an embodiment of the present application further provides a flying apparatus 800. The flying apparatus 800 includes an unmanned aerial vehicle 600 and the foregoing remote control 400, the remote control 400 being configured to perform remote control on the unmanned aerial vehicle 600. The remote control 400 includes a remote control body 100 and a display assembly 200, the display assembly 200 including a display screen 210 and being rotatably connected to the remote control body 100, so that the remote control 400 has its own display screen 210. When the remote control 400 is used, the display screen 210 can be seen by turning the display assembly 200 open, and the operation is relatively convenient. When the remote control 400 is not used, the display assembly 200 is closed, so that the space needed for packing the remote control 400 is relatively small, facilitating carriage of the remote control 400. The remote control body 100 is disposed separate from the display screen 210, so that an operation region and a display region do not affect each other, and the display area of the display screen 210 can be configured larger, thereby improving the visual experience of a user.

The foregoing descriptions are merely preferred embodiments of the present application, and are not intended to limit the present application. Any modification, equivalent replacement, improvement and the like made within the spirit and principle of the present application should fall within the protection scope of the present application.

What is claimed is:
1. A remote control, comprising:
a remote control body; and
a display assembly comprising:
   a display screen;
   a cover bottom plate;
   a screen fixing bracket; and
   a plurality of first antennas disposed in the display assembly;

wherein one of the first antennas fixed on an inner side of the screen fixing bracket is embedded into a first clamping slot and is fastened by a first buckle, and another of the first antennas is fixed on the cover bottom plate;

wherein the first clamping slot and the first buckle are disposed in the display assembly, the first buckle being disposed on two sides of the first clamping slot;

wherein the remote control body comprises a second antenna being embedded into a second clamping slot and being fastened by a second buckle, wherein the second clamping slot and the second buckle are disposed in the remote control body, and the second buckle is disposed on two sides of the second clamping slot.

2. The remote control according to claim 1, wherein the display screen is fixed on an upper side of the screen fixing bracket, and the cover bottom plate is fixed on a lower side of the screen fixing bracket.

3. The remote control according to claim 1, wherein the cover bottom plate is a non-metallic material.

4. The remote control according to claim 1, wherein the cover bottom plate is a metallic material.

5. The remote control according to claim 1, wherein the first antennas comprise at least one of an image transmission antenna, a flight control antenna, a WiFi antenna, a GPS antenna, an LTE antenna, and a composite antenna;

wherein the composite antenna is compounded by at least two of an image transmission antenna, a flight control antenna, a WiFi antenna, a GPS antenna, and a LTE antenna.

6. The remote control according to claim 1, wherein the second antenna is disposed on a side in the remote control body.

7. The remote control according to claim 1, wherein the second antenna comprises at least one of an image transmission antenna, a flight control antenna, a WiFi antenna, a GPS antenna, an LTE antenna, and a composite antenna.

8. The remote control according to claim 1, wherein the hinge comprises:

a rotation member comprising a rotation shaft;

a fixing member being fixed to the remote control body, wherein the fixing member is provided with a first through hole, and the rotation shaft penetrates through the first through hole; and a fixing block fixed to the display assembly, wherein the fixing block is provided with a second through hole, the rotation shaft penetrating through the second through hole, one side of the fixing block being fixed to the display assembly, and the other side of the fixing block being fixed to the rotation shaft.

9. The remote control according to claim 8, wherein the fixing member further comprises:

a stopping block, stretched out by the fixing member on a side close to the rotation shaft, the stopping block further comprising a connection edge, the connection edge being provided with the first through hole;

the rotation member comprising:

a limiting block, provided with a third through hole, the limiting block being sleeved on the rotation shaft, and an outer edge of the limiting block being provided with an abutting portion; and a spring, configured to provide a tension force, wherein the rotation shaft sequentially penetrates through the second through hole, the limiting block and the spring, wherein when an external force is applied to open the display assembly, the rotation shaft rotates and drives the fixing member to rotate, and rotation of the fixing member drives the display assembly to rotate;

after the display assembly is opened and application of the external force is stopped, the limiting block does not rotate relative to the rotation shaft under the effect of a frictional force generated by the tension force of the spring, so that the display assembly keeps an opened angle; and when the display assembly is closed, the abutting portion moves towards a direction close to the stopping block, and when the display assembly is completely closed, the abutting portion abuts against the stopping block.

10. The remote control according to claim 1, wherein the remote control body is provided with at least one of a joystick assembly or a knob assembly;

the joystick assembly comprises a joystick bracket and a joystick, the joystick bracket being fixed in the remote control body, the joystick being rotatably connected to the joystick bracket, and the joystick stretching out of a surface which is closed with the display assembly, of the remote control body; and the knob assembly comprises a knob handle and a knob, the knob handle being fixed in the remote control body, the knob being rotatably connected to the knob handle, and the knob protruding out of a side of the remote control body.

11. A flying apparatus, comprising an unmanned aerial vehicle and the remote control according to claim 1.

* * * * *